(12) United States Patent
Bedell et al.

(10) Patent No.: US 11,062,204 B2
(45) Date of Patent: Jul. 13, 2021

(54) VOLTAGE CONTROLLED HIGHLY LINEAR RESISTIVE ELEMENTS

(71) Applicant: INTERNATIONAL BUSINESS MACHINES CORPORATION, Armonk, NY (US)

(72) Inventors: Stephen W. Bedell, Wappingers Falls, NY (US); Martin M. Frank, Dobbs Ferry, NY (US); Devendra K. Sadana, Pleasantville, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 780 days.

(21) Appl. No.: 15/802,669

(22) Filed: Nov. 3, 2017

(65) Prior Publication Data
US 2018/0225567 A1   Aug. 9, 2018

Related U.S. Application Data

(63) Continuation of application No. 15/425,482, filed on Feb. 6, 2017.

(51) Int. Cl.
| | |
|---|---|
| *G06N 3/063* | (2006.01) |
| *H01L 49/02* | (2006.01) |
| *G06N 3/04* | (2006.01) |
| *G06N 3/08* | (2006.01) |

(52) U.S. Cl.
CPC .............. *G06N 3/0635* (2013.01); *G06N 3/04* (2013.01); *G06N 3/0454* (2013.01); *G06N 3/08* (2013.01); *G06N 3/084* (2013.01); *H01L 28/20* (2013.01); *H01L 28/40* (2013.01)

(58) Field of Classification Search
CPC ...... G06N 3/04; G06N 3/0454; G06N 3/0635; G06N 3/08; G06N 3/084; H01L 28/20; H01L 28/40
See application file for complete search history.

(56) References Cited

U.S. PATENT DOCUMENTS

| | | | |
|---|---|---|---|
| 5,343,555 A * | 8/1994 | Yayla ................... | G06N 3/0675 706/35 |
| 2015/0269483 A1* | 9/2015 | Nishitani ............... | G06N 3/084 706/25 |

OTHER PUBLICATIONS

List of IBM Patents or Patent Applications Treated as Related dated Nov. 3, 2017, 2 pages.

* cited by examiner

*Primary Examiner* — Kamran Afshar
*Assistant Examiner* — Marshall L Werner
(74) *Attorney, Agent, or Firm* — Tutunjian & Bitetto, P.C.; Erik Johnson (57) ABSTRACT

Methods of training a neural network include applying an input signal to an array of weights to generate weighted output signals based on resistances of respective weights in the array of weights. A difference between the weighted output signals and a predetermined expected output is determined. Weights in the array of weights are set by applying a pulse to a controllable resistance element in each weight. The pulse increments or decrements a charge on a junction field effect transistor in the respective controllable resistance element.

4 Claims, 9 Drawing Sheets

FIG. 1

(Prior art)

VOLTAGE CONTROLLED HIGHLY LINEAR RESISTIVE ELEMENTS

BACKGROUND

Technical Field

The present invention generally relates to neuromorphic circuits and, more particularly, to voltage-controlled resistive elements in neuromorphic circuits.

Description of the Related Art

An artificial neural network (ANN) is an information processing system that is inspired by biological nervous systems, such as the brain. The key element of ANNs is the structure of the information processing system, which includes a large number of highly interconnected processing elements (called "neurons") working in parallel to solve specific problems. ANNs are furthermore trained in-use, with learning that involves adjustments to weights that exist between the neurons. An ANN is configured for a specific application, such as pattern recognition or data classification, through such a learning process.

Figure 1:
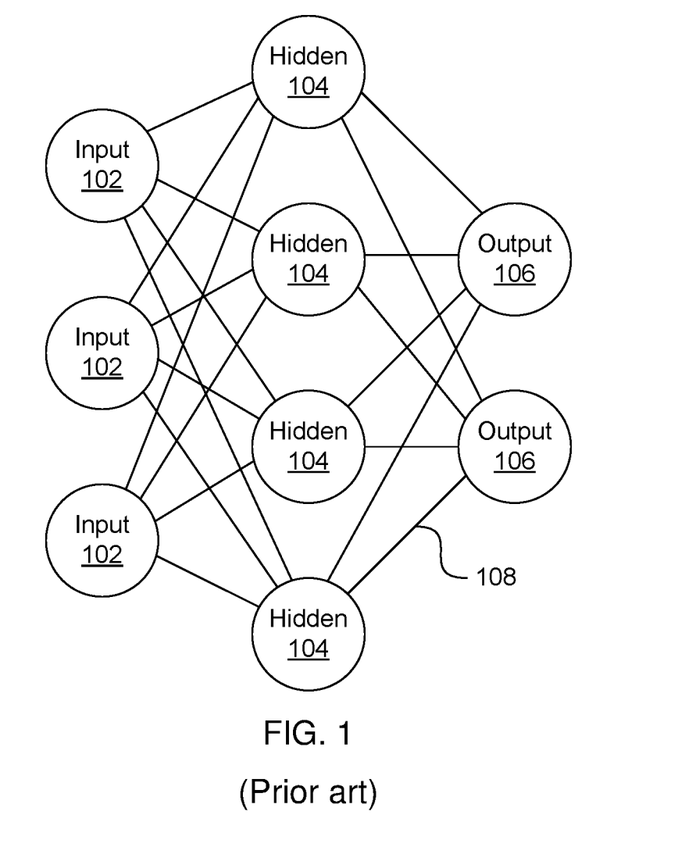
FIG. 1 is a diagram of a general neural network.

Referring now to FIG. 1, a generalized diagram of a neural network is shown. ANNs demonstrate an ability to derive meaning from complicated or imprecise data and can be used to extract patterns and detect trends that are too complex to be detected by humans or other computer-based systems. The structure of a neural network is known generally to have input neurons 102 that provide information to one or more "hidden" neurons 104. Connections 108 between the input neurons 102 and hidden neurons 104 are weighted and these weighted inputs are then processed by the hidden neurons 104 according to some function in the hidden neurons 104, with weighted connections 108 between the layers. There may be any number of layers of hidden neurons 104, and as well as neurons that perform different functions. There exist different neural network structures as well, such as convolutional neural network, maxout network, etc. Finally, a set of output neurons 106 accepts and processes weighted input from the last set of hidden neurons 104.

This represents a "feed-forward" computation, where information propagates from input neurons 102 to the output neurons 106. Upon completion of a feed-forward computation, the output is compared to a desired output available from training data. The error relative to the training data is then processed in "feed-back" computation, where the hidden neurons 104 and input neurons 102 receive information regarding the error propagating backward from the output neurons 106. Once the backward error propagation has been completed, weight updates are performed, with the weighted connections 108 being updated to account for the received error. This represents just one variety of ANN.

One challenge in implementing ANNs lies in the structure of the weights. When forming weight structures in dedicated hardware systems, existing weights lack linearity and/or are formed with exotic materials.

SUMMARY

A controllable resistance element includes junction field effect transistor configured to provide a resistance on a signal line. A first pass transistor is configured to apply a charge increment or decrement to the junction field effect transistor responsive to a control pulse, such that the resistance on the signal line changes.

A weight array includes a plurality of controllable resistance elements. Each controllable resistance element includes a junction field effect transistor configured to provide a resistance on a signal line and a first pass transistor configured to apply a charge increment or decrement to the junction field effect transistor responsive to a control pulse, such that the resistance on the signal line changes. A plurality of AND gates are configured to control addressing of the plurality of controllable resistance elements. The control pulse is only passed to a controllable resistance element when a respective AND gate is triggered.

A method of training a neural network includes applying an input signal to an array of weights to generate weighted output signals based on resistances of respective weights in the array of weights. A difference between the weighted output signals and a predetermined expected output is determined. Weights in the array of weights are set by applying a pulse to a controllable resistance element in each weight. The pulse increments or decrements a charge on a junction field effect transistor in the respective controllable resistance element.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present embodiments implement artificial neural networks (ANNs) using weight arrays that employ voltage-controlled memristive elements. In specific embodiments, junction gate field effect transistors (JFETs) are used to control the resistivity of the weights in a predictable, linear fashion.

Figure 2:
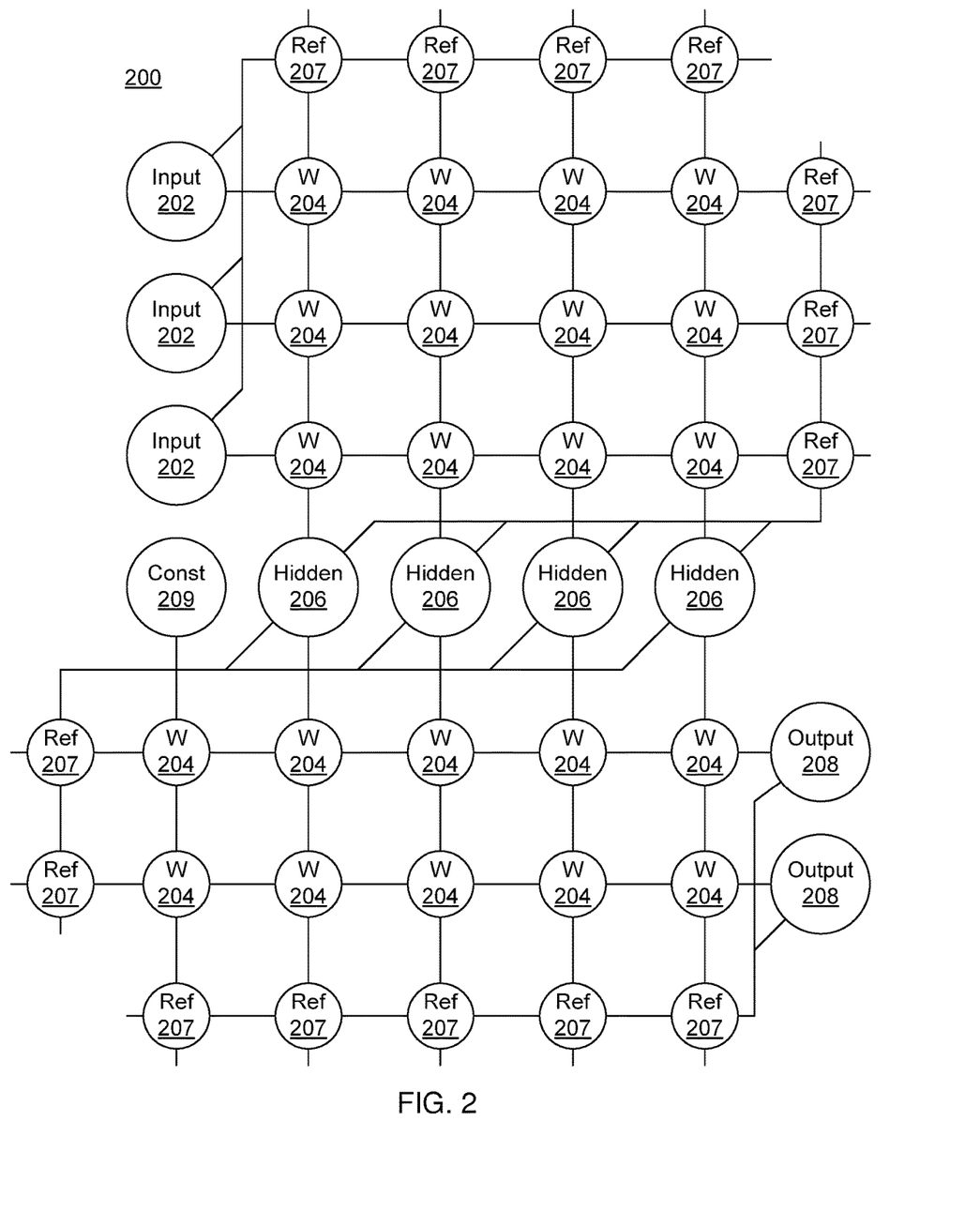
FIG. 2 is a diagram of a neural network that employs controllable resistive elements as weights in accordance with the present embodiments.

Referring now to the drawings in which like numerals represent the same or similar elements and initially to FIG.

2, an artificial neural network (ANN) architecture 200 is shown. It should be understood that the present architecture is purely exemplary and that other architectures or types of neural network may be used instead. During feed-forward operation, a set of input neurons 202 each provide an input voltage in parallel to a respective row of weights 204. The weights 204 each have a settable resistance value, such that a current output flows from the weight 204 to a respective hidden neuron 206 to represent the weighted input. The current output by a given weight is determined as $$I = \frac{V}{r},$$

where V is the input voltage from the input neuron 202 and r is the set resistance of the weight 204. The current from each weight adds column-wise and flows to a hidden neuron 206. A set of reference weights 207 have a fixed resistance and combine their outputs into a reference current that is provided to each of the hidden neurons 206. Because conductance values can only be positive numbers, some reference conductance is needed to encode both positive and negative values in the matrix. The currents produced by the weights 204 are continuously valued and positive, and therefore the reference weights 207 are used to provide a reference current, above which currents are considered to have positive values and below which currents are considered to have negative values.

As an alternative to using the reference weights 207, another embodiment may use separate arrays of weights 204 to capture negative values. Each approach has advantages and disadvantages. Using the reference weights 207 is more efficient in chip area, but reference values need to be matched closely to one another. In contrast, the use of a separate array for negative values does not involve close matching as each value has a pair of weights to compare against. However, the negative weight matrix approach uses roughly twice the chip area as compared to the single reference weight column. In addition, the reference weight column generates a current that needs to be copied to each neuron for comparison, whereas a negative matrix array provides a reference value directly for each neuron. In the negative array embodiment, the weights 204 of both positive and negative arrays are updated, but this also increases signal-to-noise ratio as each weight value is a difference of two conductance values. The two embodiments provide identical functionality in encoding a negative value and those having ordinary skill in the art will be able to choose a suitable embodiment for the application at hand.

The hidden neurons 206 use the currents from the array of weights 204 and the reference weights 207 to perform some calculation. The hidden neurons 206 then output a voltage of their own to another array of weights 207. This array performs in the same way, with a column of weights 204 receiving a voltage from their respective hidden neuron 206 to produce a weighted current output that adds row-wise and is provided to the output neuron 208.

It should be understood that any number of these stages may be implemented, by interposing additional layers of arrays and hidden neurons 206. It should also be noted that some neurons may be constant neurons 209, which provide a constant voltage to the array. The constant neurons 209 can be present among the input neurons 202 and/or hidden neurons 206 and are only used during feed-forward operation.

During back propagation, the output neurons 208 provide a voltage back across the array of weights 204. The output layer compares the generated network response to training data and computes an error. The error is applied to the array as a voltage pulse, where the height and/or duration of the pulse is modulated proportional to the error value. In this example, a row of weights 204 receives a voltage from a respective output neuron 208 in parallel and converts that voltage into a current which adds column-wise to provide an input to hidden neurons 206. The hidden neurons 206 provide combine the weighted feedback signal with a derivative of its feed-forward calculation and stores an error value before outputting a feedback signal voltage to its respective column of weights 204. This back propagation travels through the entire network 200 until all hidden neurons 206 and the input neurons 202 have stored an error value.

During weight updates, the input neurons 202 and hidden neurons 206 apply a first weight update voltage forward and the output neurons 208 and hidden neurons 206 apply a second weight update voltage backward through the network 200. The combinations of these voltages create a state change within each weight 204, causing the weight 204 to take on a new resistance value. In this manner the weights 204 can be trained to adapt the neural network 200 to errors in its processing. It should be noted that the three modes of operation, feed forward, back propagation, and weight update, do not overlap with one another.

Figure 3:
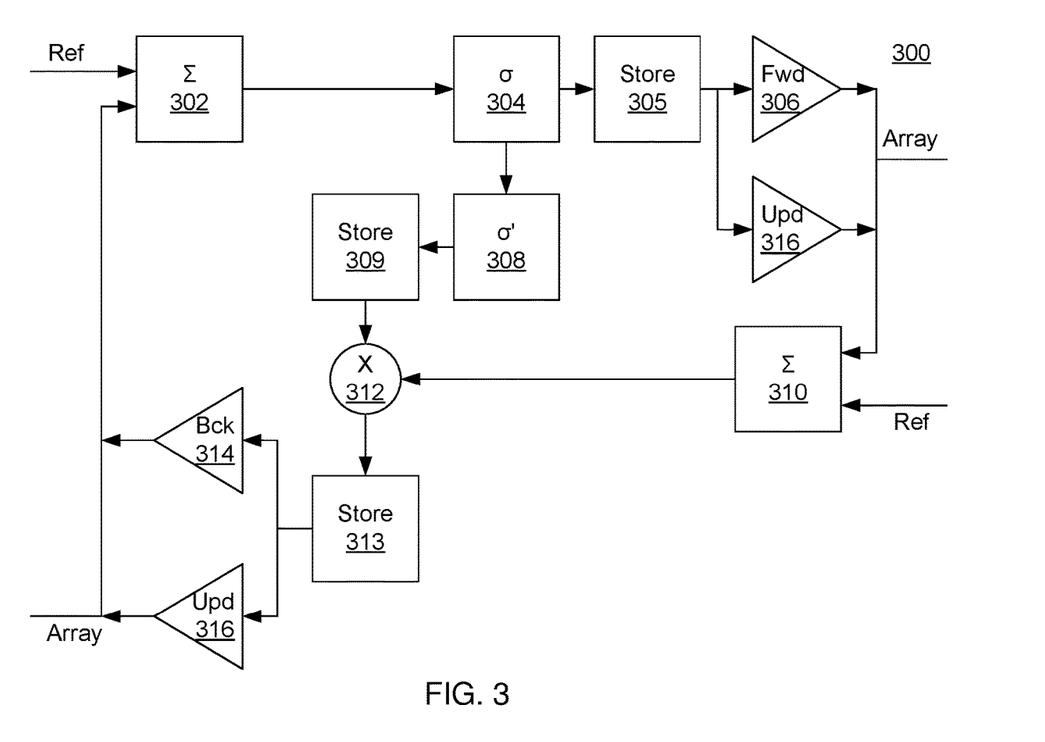
FIG. 3 is a block diagram of a neural network control circuit in accordance with the present embodiments.

Referring now to FIG. 3, a block diagram of a neuron 300 is shown. This neuron may represent any of the input neurons 202, the hidden neurons 206, or the output neurons 208. It should be noted that FIG. 3 shows components to address all three phases of operation: feed forward, back propagation, and weight update. However, because the different phases do not overlap, there will necessarily be some form of control mechanism within in the neuron 300 to control which components are active. It should therefore be understood that there may be switches and other structures that are not shown in the neuron 300 to handle switching between modes.

In feed forward mode, a difference block 302 determines the value of the input from the array by comparing it to the reference input. This sets both a magnitude and a sign (e.g., + or −) of the input to the neuron 300 from the array. Block 304 performs a computation based on the input, the output of which is stored in storage 305. It is specifically contemplated that block 304 computes a non-linear function and may be implemented as analog or digital circuitry or may be performed in software. The value determined by the function block 304 is converted to a voltage at feed forward generator 306, which applies the voltage to the next array. The signal propagates this way by passing through multiple layers of arrays and neurons until it reaches the final output layer of neurons. The input is also applied to a derivative of the non-linear function in block 308, the output of which is stored in memory 309.

During back propagation mode, an error signal is generated. The error signal may be generated at an output neuron 208 or may be computed by a separate unit that accepts inputs from the output neurons 208 and compares the output to a correct output based on the training data. Otherwise, if the neuron 300 is a hidden neuron 206, it receives back propagating information from the array of weights 204 and compares the received information with the reference signal at difference block 310 to provide a continuously valued, signed error signal. This error signal is multiplied by the derivative of the non-linear function from the previous feed forward step stored in memory 309 using a multiplier 312, with the result being stored in the storage 313. The value determined by the multiplier 312 is converted to a backwards propagating voltage pulse proportional to the computed error at back propagation generator 314, which applies the voltage to the previous array. The error signal propagates in this way by passing through multiple layers of arrays and neurons until it reaches the input layer of neurons 202.

During weight update mode, after both forward and backward passes are completed, each weight 204 is updated proportional to the product of the signal passed through the weight during the forward and backward passes. The update signal generators 316 provide voltage pulses in both directions (though note that, for input and output neurons, only one direction will be available). The shapes and amplitudes of the pulses from update generators 316 are configured to change a state of the weights 204, such that the resistance of the weights 204 is updated.

In one particular embodiment, the weights 204 may be implemented in hardware, using relatively complicated weighting circuitry or using resistive cross point devices. It is specifically contemplated that the weights 204 have a highly linear response. The weights 204 may belong to a class of device called a resistive processing unit (RPU), because their non-linear characteristics are used to perform calculations in the neural network 200. The RPU devices may be implemented with resistive random access memory (RRAM), phase change memory (PCM), programmable metallization cell (PMC) memory, or any other device that has non-linear resistive switching characteristics. Such RPU devices may also be considered as memristive systems. The present embodiments provide different RPU embodiments based on JFETs.

One important aspect of ANNs is the linearity of the resistive path through the weights 204. In the present embodiments, the resistance is controlled using a voltage or current source. Such sources can be implemented as steady-state biases or as pulses. Symmetric update characteristics are preferred for updates to the weights 204 where, after a positive and a subsequent negative pulse, the resistive element should return to the weight it had prior to the pulses. Linear variation of resistance or conductance with the number of pulses is also provided herein. Most existing approaches to achieving these effects include exotic materials or have difficult-to-control resistive behaviors. Another drawback to existing voltage-controlled resistors is that there is generally a threshold voltage needed to change the resistance. Computations using such devices need to keep their voltages below this threshold to avoid changing the resistance state, limiting the operational range of the array.

The present embodiments use JFETs, with or without voltage feedback, to provide voltage-controlled resistive (VCR) elements. Such elements may be used in, e.g., neuromorphic arrays as the weights 204 or may be used in any other appropriate application. Some embodiments include a capacitive element or other charge-integrating element in conjunction with the VCR to provide stepwise pulsed current control of the resistive element.

The VCR and optional capacitive element may be discrete components or may be monolithically integrated into a single substrate. Trench capacitor structures may be used as the capacitive element, but the capacitive element may alternatively include semiconductor devices such as diodes and transistors or passive elements such as resistors and capacitors to act as a sample-and-hold circuit for pulse mode control over the resistive element. As a result, the present embodiments may be employed to provide arrays of linearly resistive elements using at any appropriate scale and with readily simulated circuit behavior. Thus the present embodiments provide no-threshold resistive control, large operational range (e.g., between about −5 V and +5 V or greater), and voltage-independent resistance for the signal voltages.

Figure 4:
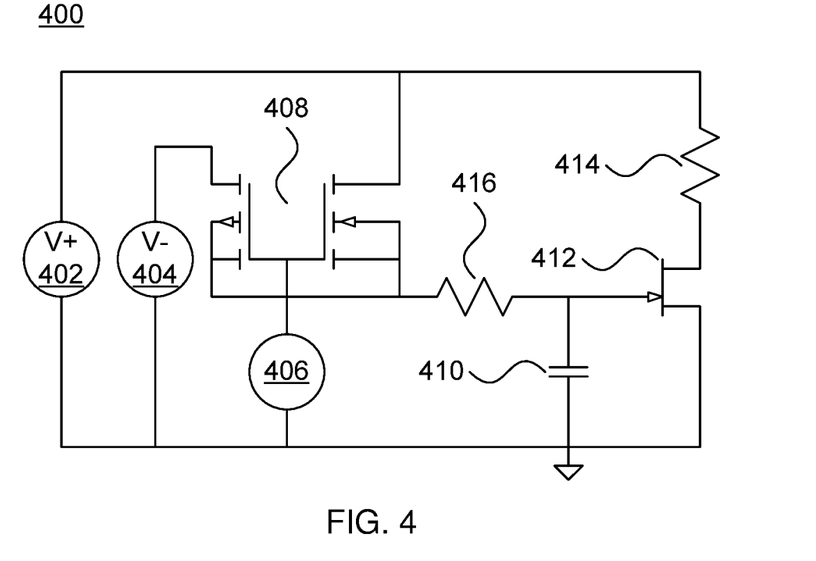
FIG. 4 is a circuit diagram of a controllable resistive element in accordance with the present embodiments.

Referring now to FIG. 4, a voltage-controlled resistance circuit 400 is shown. The circuit 400 includes inputs for a V+ voltage source 402, a V− voltage source 404, and a pulse control 406. Pass transistors 408 are triggered by the pulse control 406 to pass a fixed, predictable amount of charge into the circuit. A capacitor 410 integrates the current passing through resistor 416 and stores the charge, which provides the gate bias of a JFET 412. A sense resistor 414 acts as a voltage divider. In an alternative embodiment, the sense resistor 414 may be omitted, with the collector of the JFET 412 being left open.

The pulse applied by pulse control 406 may be positive or negative, activating a respective nFET or pFET from the pass transistors 408, which may be implemented in some embodiments as metal oxide semiconductor field effect transistors (MOSFETs). In alternative embodiments, the pass transistors 408 may be implemented as JFETs. In this embodiment, the pass transistors 408 are arranged back-to-back in a complimentary configuration.

When a positive pulse arrives at pulse control 406, the nFET exposes the positive voltage 402 to add charge to the circuit. When a negative pulse arrives at pulse control 406, the pFET exposes the negative voltage 404 to remove charge from the circuit. In this manner, an amount of charge is held at the gate of the JFET 412, causing the JFET 412 to act as a variable resistor having a resistance that is linearly determined by the amount of charge.

The gate region of the JEFT 412 forms a semiconductor p/n junction (or a metal/semiconductor junction in the case of a metal-semiconductor field effect transistor (MESFET)). Because there is only one charge carrier present in the JFET 412, when the gate is reverse-biased, the carrier concentration under the gate is reduced as the depletion layer grows. This behavior is distinct from that of bipolar transistors and MOSFETs. JFETs also have a high input impedance (e.g., in excess of about $10^{12}$ ohms). Due to this high input impedance, if a low-leakage capacitor 410 is coupled to the gate, any charge injected into the capacitor will have a large retention time and will therefore be quasi-permanent. In general, a p-channel JFET needs a positive voltage at the gate to increase source/drain resistance, while an n-channel JFET needs a negative charge at the gate to increase source/drain resistance.

The JFET 412 should have a large resistance range. It is specifically contemplated that the JFET 412 should have a relatively large base source/drain resistance. As neural networks grow in size, larger resistances are useful to keep the current draw low. Thus, it is contemplated that the JFET 412 may have a base source/drain resistance greater than about 50 kΩ and, in some cases, this resistance may be measured in megaohms. The JFET 412 will have a resistance range of, e.g., about 10× variation to about 50× variation.

Figure 5:
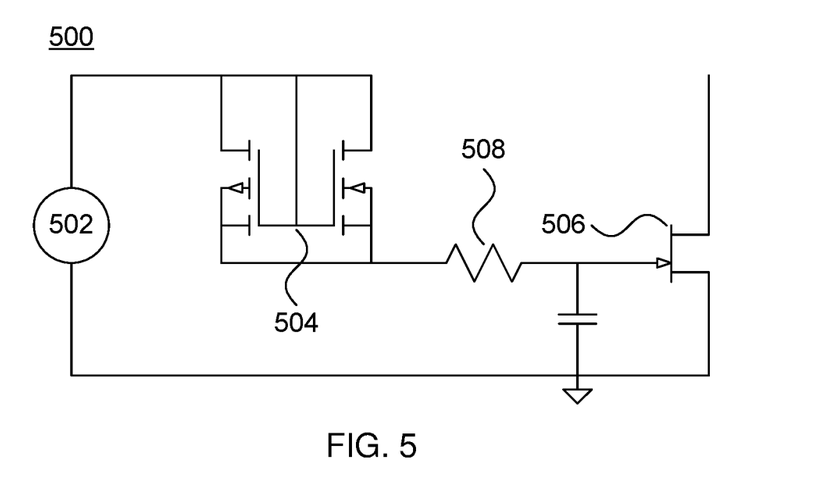
FIG. 5 is a circuit diagram of a controllable resistive element in accordance with the present embodiments.

Referring now to FIG. 5, a voltage-controlled resistance circuit 500 is shown. In this embodiment, instead of connecting the drains of the pass transistors 504 to respective + and − power supplies, the drains are connected to the common gate node. This simplifies the wiring by using the pulse signal 502 itself as the current/charge source. In practice, the current control resistor 508 between the pass transistors and the JFET 506 may have a resistance of, e.g., multiple megaohms. This configuration reduces leakage current, because the backward leakage path would be along the pulse bus line rather than the power supplies. Leakage current can be further reduced if the pulse source 502 is in an "open collector" configuration and floats between pulses. The pulse source 502 should have a stiff enough voltage source that it does not suffer voltage droop in larger arrays where the current draw can be large.

Figure 6:
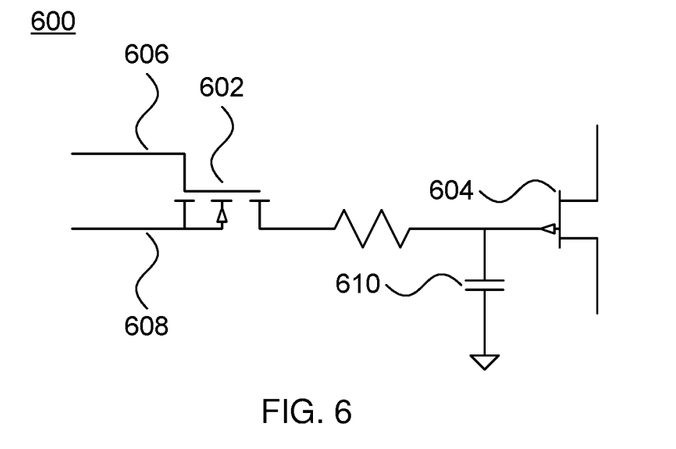
FIG. 6 is a circuit diagram of a controllable resistive element in accordance with the present embodiments.

Referring now to FIG. 6, a voltage-controlled resistance circuit 600 is shown. Notably only a single pass transistor 602 is employed, gated by an "enable" signal 606 and with a terminal connected to a pulse bus 608. As before, the output of the pass transistor 602 adds or removes a charge at the gate of the JFET 604. This circuit 600 uses only a single polarity (e.g., positive), which eliminates the need for a second power supply rail and wiring. Although a p-channel JFET 604 is shown in this specific embodiment, alternative embodiments may replace the p-channel JFET 604 and its positive power supply with an n-channel JFET that is charged using a negative power supply. Rather than charging the capacitor 610 with a pulse having a first polarity and discharging with pulse having a second polarity, discharge is performed by grounding the pulse bus 608.

Figure 7:
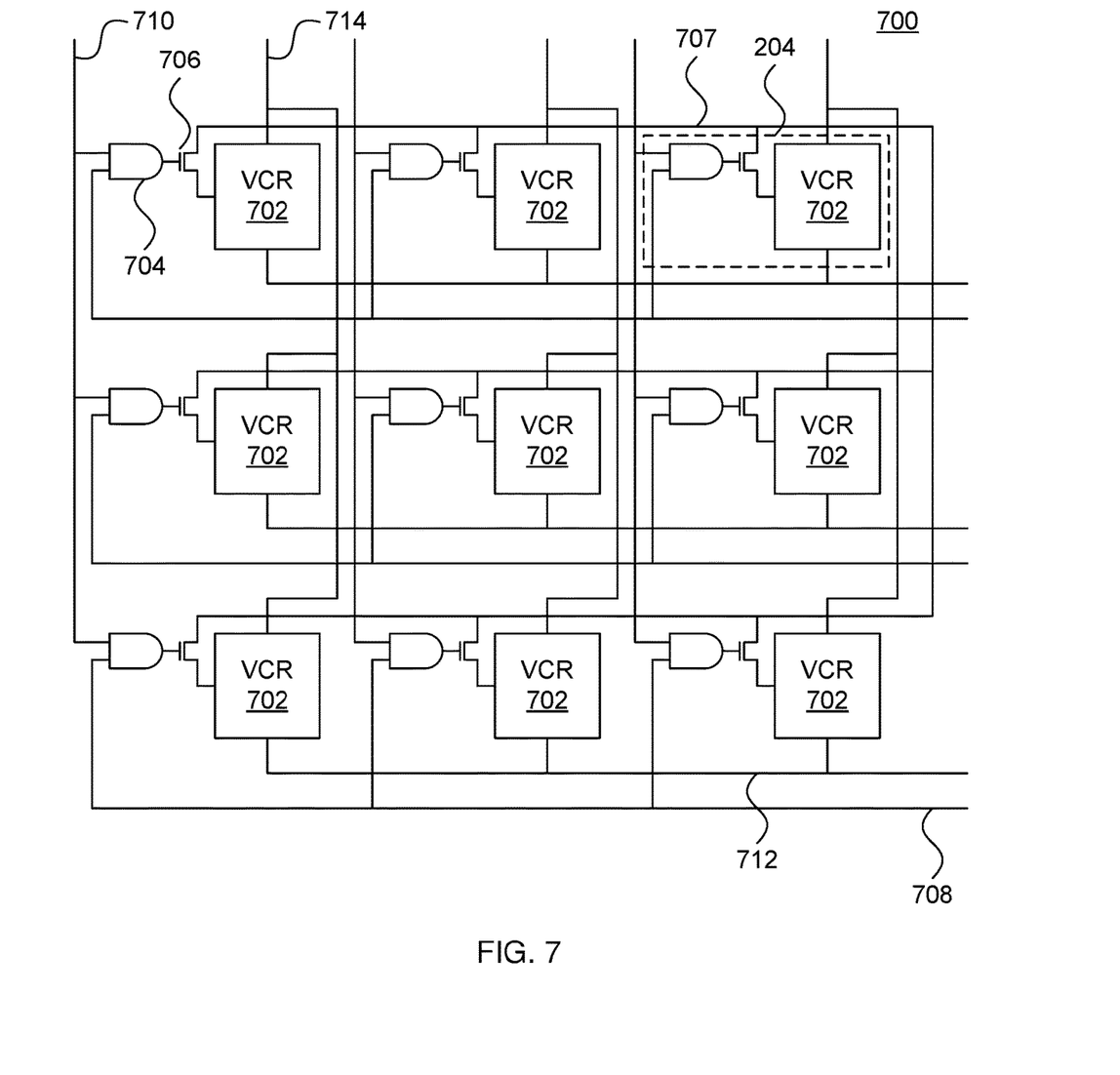
FIG. 7 is a block diagram of a weight array employing controllable resistive elements in accordance with the present embodiments.

Referring now to FIG. 7, an array 700 of weights 204 is shown. Each weight 204 includes a VCR 702, an AND gate 704, and an access transistor 706 that may be implemented as a FET. In this embodiment, the VCRs 702 may be implemented as set forth in FIGS. 4 and 5 above. Each weight 204 receives an input from a pulse bus 707, a first pulse address 710, and a second pulse address 708. The pulse addresses 708 and 710 feed into the AND gate 704 to trigger the passage of a pulse from pulse bus 707 into the VCR 702, which adjusts its resistance in the manner described above. In this manner, specific weights 204 can be addressed for respective positive and negative pulses to adjust the weighting applied to input signals.

During operation, the VCR 702 has an input path 714 and an output path 712 that carries input signals from input neurons 202 and passes weighted signals onward toward the output neurons 208. The weighted signal has a voltage drop relative to the input signal based on the present resistance of the VCR 702.

Figure 8:
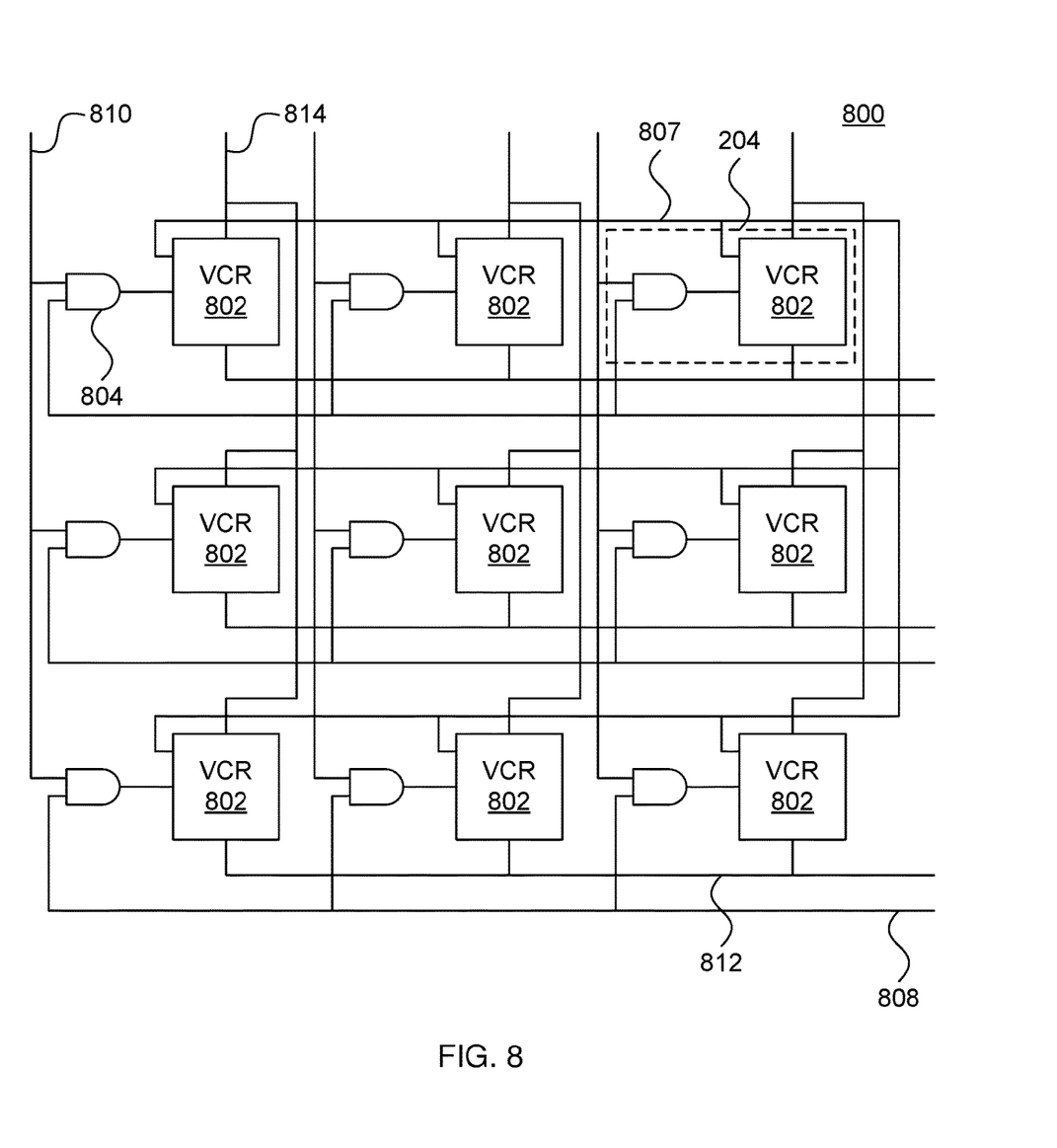
FIG. 8 is a block diagram of a weight array employing controllable resistive elements in accordance with the present embodiments.

Referring now to FIG. 8, an array 800 of weights 204 is shown. In this embodiment, the weights 204 are implemented with a VCR 802 such as that described with respect to FIG. 6 above. The weights 204 include an AND gate 804, but omit an access transistor. The VCR 802 accepts an input for pulse bus 807 as well as address signals 808 and 810. When both address signals 808 and 810 are on at the same time, the AND gate 804 provides an enable signal to the VCR 802 that triggers the introduction of new charge from the pulse bus 807. Alternatively, if the pulse bus 807 is grounded, charge will be removed from the VCR 802. As with the above embodiments, during operation input signals on input path 814 are weighted by the VCR and the weighted signals are output on output path 812.

Figure 9:
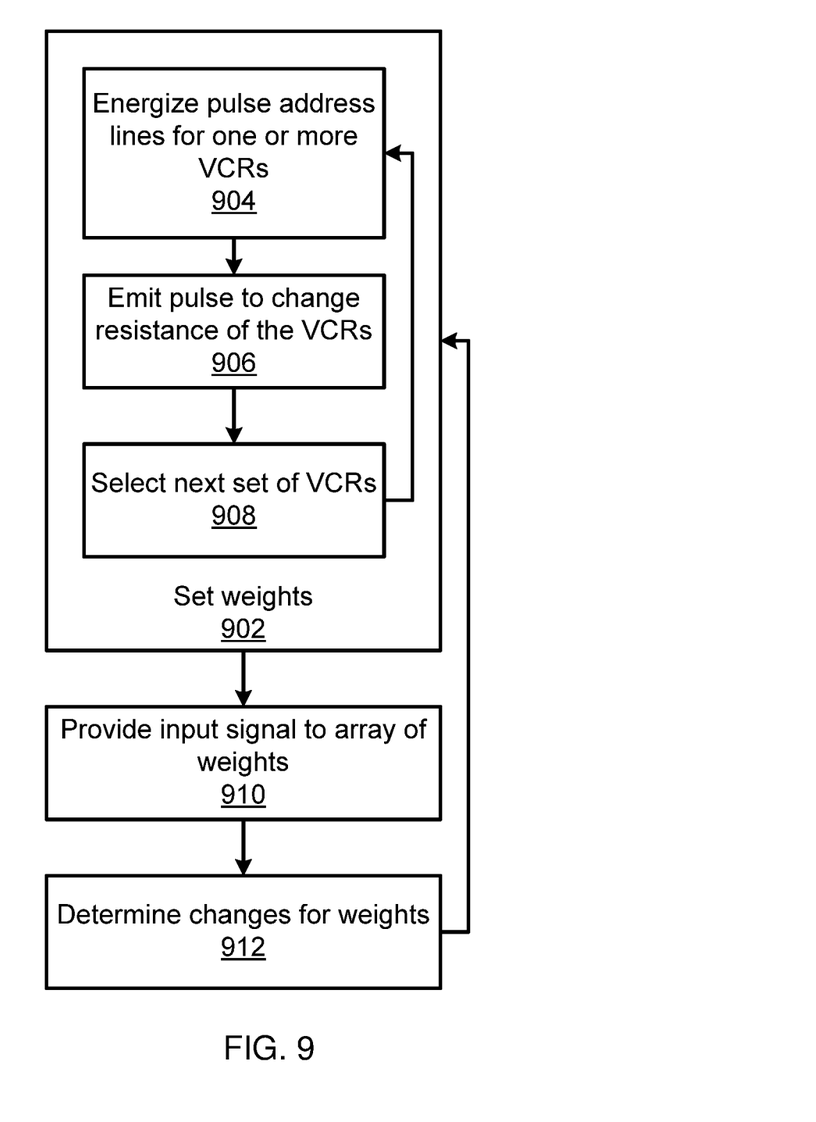
FIG. 9 is a block/flow diagram of a method of training a neural network in accordance with the present embodiments.

Referring now to FIG. 9, a method for training an array 700 or 800 in a neural network is shown. Block 902 sets the weights 204 by energizing the pulse address lines (e.g., 708/710 or 808/810) for a particular VCR 702 or 802 in block 904. Block 906 emits a pulse on pulse bus 707/807 to change the resistance of the VCR 702 or 802, applying a fixed charge to the JFET in the VCR 702/802. In the context of FIGS. 4 and 5, this pulse may be positive or negative. In the context of FIG. 6, the pulse is only one polarity, with the removal of charge being performed by grounding the pulse bus 807. Block 908 selects the next VCR 702/802 in the array 700/800 and the process continues until all weights are set.

Block 910 then provides an input signal to the array 700/800, with the input signal being weighted by the resistance of each weight 204, such that the output signals have amplitudes determined by the weights 204. After this calculation is performed, block 912 determines how much the magnitude of the weights 204 should be changed. It is specifically contemplated that a control module may determine the error signals and may furthermore control the setting of the weights 204 in block 902. Alternatively, a distributed, localized alteration of the weights through back-propagation may be employed. Processing returns to block 902 to set the weights accordingly. After the neural network is trained, calculations can be performed by applying an input signal and measuring the output.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 10:
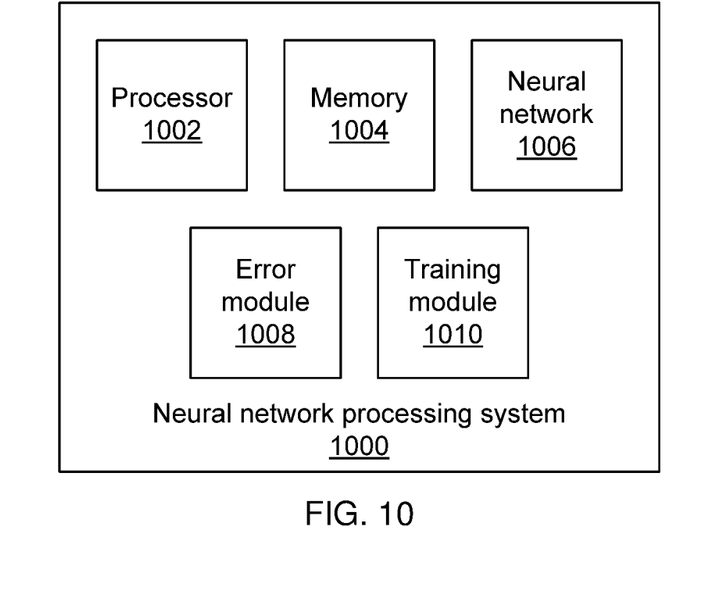
FIG. 10 is a block diagram of a neural network processing system in accordance with the present embodiments.

Referring now to FIG. 10, a neural network processing system 1000 is shown. The neural network processing system 1000 includes a hardware processor 1002 and memory 1004. In addition, a neural network 1006 is implemented using, e.g., the arrays of weights 204 described above. The neural network 1006 may be implemented entirely in hardware or may be a combination of hardware elements and software elements. The neural network processing system 1000 also includes one or more functional modules. The functional modules may be implemented as software that is stored in memory 1004 and executed by processor 1002. In alternative embodiments, the functional modules may be implemented as one or more discrete hardware components in the form of, e.g., application specific integrated chips or field programmable gate arrays.

An error module 1008 is used during training of the neural network 1006 to determine how much a measured output differs from the expected output. A training module 1010 then addresses the weights 204 in the weight arrays 700/800 and applies an appropriate pulse to change the resistance of each respective weight 204. This is continued until training is complete, at which point the neural network 1006 can be used directly to perform computations.

Having described preferred embodiments of voltage controlled highly linear resistive elements (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of training a neural network, comprising:
applying an input signal to an array of weights to generate weighted output signals based on resistances of respective weights in the array of weights;
determining a difference between the weighted output signals and a predetermined expected output; and
setting weights in the array of weights by applying a pulse to a controllable resistance element in each weight, wherein the pulse increments or decrements a static charge on a junction field effect transistor in the respective controllable resistance element, wherein the static charge is stored by a capacitor connected in parallel with a gate of the junction field effect transistor.

2. The method of claim 1, wherein setting the weights in the array of weights comprises incrementing or decrementing the static charge in accordance with a polarity of the pulse.

3. The method of claim 1, wherein setting the weights in the array of weights comprises decreasing the static charge by grounding a pulse bus.

4. The method of claim 1, wherein applying the input signal to the array of weights comprises applying the input signal to the controllable resistance element in each weight.

* * * * *